United States Patent
Hayashi

(10) Patent No.: US 10,348,216 B2
(45) Date of Patent: Jul. 9, 2019

(54) ELECTRIC POWER CONVERTING APPARATUS WITH INNER PLANE OF CONTROL BOARD FIXED TO HOUSING

(71) Applicant: MITSUBISHI ELECTRIC CORPORATION, Chiyoda-ku (JP)

(72) Inventor: Komei Hayashi, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 16/078,957

(22) PCT Filed: Aug. 9, 2016

(86) PCT No.: PCT/JP2016/073455
§ 371 (c)(1),
(2) Date: Aug. 22, 2018

(87) PCT Pub. No.: WO2017/149801
PCT Pub. Date: Sep. 8, 2017

(65) Prior Publication Data
US 2019/0052186 A1    Feb. 14, 2019

(30) Foreign Application Priority Data
Mar. 2, 2016   (JP) .................................. 2016-039749

(51) Int. Cl.
*H02M 7/48*    (2007.01)
*H05K 7/14*    (2006.01)
(Continued)

(52) U.S. Cl.
CPC .............. *H02M 7/48* (2013.01); *B60L 11/00* (2013.01); *H05K 5/0026* (2013.01); *H05K 7/14* (2013.01);
(Continued)

(58) Field of Classification Search
CPC ...................................................... H02M 7/003
See application file for complete search history.

(56) References Cited

U.S. PATENT DOCUMENTS

| 5,497,289 A | * | 3/1996 | Sugishima | ............ H02M 7/003 318/558 |
| 6,735,968 B2 | * | 5/2004 | Kurita | ................... F25B 49/025 361/735 |

(Continued)

FOREIGN PATENT DOCUMENTS

| JP | 2004-140114 A | 5/2004 |
| JP | 4119727 B2 | 7/2008 |

(Continued)

OTHER PUBLICATIONS

International Search Report dated Oct. 18, 2018 in PCT/JP2016/073455 filed Aug. 9, 2016.

*Primary Examiner* — Harry R Behm
(74) *Attorney, Agent, or Firm* — Oblon, McClelland, Maier & Neustadt, L.L.P.

(57) ABSTRACT

An electric power converting apparatus includes: a first controlling circuit board disposed inside a housing; and a second controlling circuit board disposed inside the housing on an opposite side of the first controlling circuit board from a power module, wherein: an inner plane of the first controlling circuit board is fixed to a cooler or the housing by a first fixing member on an opposite side of the first controlling circuit board from the second controlling circuit board; an inner plane of the second controlling circuit board is fixed to the housing by a second fixing member on an opposite side of the second controlling circuit board from the first controlling circuit board; and the first controlling circuit board and the second controlling circuit board are (Continued)

electrically connected on facing inner planes of the first controlling circuit board and the second controlling circuit board.

18 Claims, 6 Drawing Sheets

(51) Int. Cl.
  *B60L 11/00* (2006.01)
  *H05K 7/20* (2006.01)
  *H05K 5/00* (2006.01)
  *H02M 7/00* (2006.01)

(52) U.S. Cl.
  CPC ............ *H05K 7/20* (2013.01); *B60L 2200/26* (2013.01); *H02M 7/003* (2013.01)

(56) References Cited

U.S. PATENT DOCUMENTS

| | | | | |
|---|---|---|---|---|
| 2003/0067749 | A1* | 4/2003 | Tamba | H05K 7/20927 361/699 |
| 2013/0128646 | A1* | 5/2013 | Nishihara | H01L 23/367 363/141 |
| 2015/0008443 | A1* | 1/2015 | Yamashita | H02M 7/003 257/76 |
| 2015/0305188 | A1* | 10/2015 | Maeda | H05K 7/1432 361/728 |

FOREIGN PATENT DOCUMENTS

| | | |
|---|---|---|
| JP | 2010-183749 A | 8/2010 |
| JP | 2012-16108 A | 1/2012 |
| JP | 2014-241726 A | 12/2014 |

\* cited by examiner

ELECTRIC POWER CONVERTING APPARATUS WITH INNER PLANE OF CONTROL BOARD FIXED TO HOUSING

TECHNICAL FIELD

The present invention relates to an electric power converting apparatus that converts electric power from a battery into electric driving power that is supplied to an electric motor of an automobile, for example.

BACKGROUND ART

In electric vehicles powered by an electric motor, and hybrid vehicles that are powered using a combination of an electric motor and an internal combustion engine, etc., an electric power converting apparatus is mounted that converts electric power from a battery into electric driving power that is supplied to the electric motor, for example. The electric power converting apparatus includes: electrical components such as a power module that includes switching elements such as insulated gate bipolar transistors (IGBTs), a cooler that radiates generated heat from the power modules, a controlling circuit board that controls driving of the power module, etc.; and a housing that houses the electrical components, and that protects the electrical components from external dust, etc. In electric vehicles and hybrid vehicles, there is demand for good collision safety and comfort, and in mounted electric power converting apparatuses, shapes that enable effective use of space are desired. For effective use of space, it is desirable for the electric power converting apparatus to be compact, and for vibration resistance to be high so as not to be damaged even if mounted to positions on which vibrational loads from the engine and road surfaces act easily, such as above a transaxle inside an engine compartment, etc. Among the parts that are mounted to the electric power converting apparatus, since the controlling circuit board in particular is thin and has a large area compared to other parts, it resonates due to vibration acting from the transaxle, and its displacement amplitude is great, resulting in mounted parts being damaged.

In consideration of such conditions, various techniques have been proposed that attempt to make the controlling circuit board highly vibration-proof.

In a conventional electric power converting apparatus that is described in Patent Literature 1, for example, an attempt has been made to make a controlling circuit board highly vibration-proof by fixing to and holding, by a highly rigid circuit board holding bracket, a single controlling circuit board among a plurality of controlling circuit boards that are disposed so as to be stacked on a power module.

In a conventional automotive air-conditioner controlling apparatus that is described in Patent Literature 2, an attempt has been made to make a controlling circuit board highly vibration-proof by supporting a plurality of controlling circuit boards using supporting posts that pass through.

CITATION LIST

Patent Literature

Patent Literature 1: Japanese Patent Laid-Open No. 2010-183749 (Gazette)
Patent Literature 2: Japanese Patent Laid-Open No. 2004-140114 (Gazette)

SUMMARY OF THE INVENTION

Problem to be Solved by the Invention

In the conventional electric power converting apparatus that is described in Patent Literature 1, because a plurality of connectors are disposed on one side of the controlling circuit boards, and exchange of signals with the controlling circuit boards is performed by connecting the connectors using signal harnesses, circuits are required for gathering the signals to one side of the controlling circuit boards. Thus, some problems have been that packing density of the controlling circuit boards decreases, increasing the controlling circuit boards in size, and the resonant frequencies of the controlling circuit boards decrease, reducing vibration resistance. In addition, because the housing that houses the controlling circuit boards increases in size if the controlling circuit boards are increased in size, another problem has been that the resonant frequency of the housing decreases, reducing vibration resistance.

In the conventional automotive air-conditioner controlling apparatus that is described in Patent Literature 2, because the supporting posts for supporting and fixing are disposed so as to pass through the stacked controlling circuit boards, spaces in which parts cannot be mounted arise in the vicinity of supporting post passage portions of the respective controlling circuit boards. Because these supporting posts pass through at identical positions of inner planes of the respective controlling circuit boards, parts cannot be mounted freely on each of the controlling circuit boards, reducing packing density. Thus, some problems have been that the controlling circuit boards are increased in size, and the resonant frequencies of the controlling circuit boards decrease, reducing vibration resistance.

The present invention aims to solve the above problems and an object of the present invention is to provide a compact electric power converting apparatus that has superior vibration resistance.

Means for Solving the Problem

An electric power converting apparatus according to the present invention includes: a housing; a cooler that is fixed to the housing, and that is disposed inside the housing; a power module that is mounted to the cooler; a first controlling circuit board that is electrically connected to the power module, and that is disposed inside the housing on an opposite side of the power module from the cooler such that outer circumferential edge portions thereof are held; and a second controlling circuit board that is electrically connected to the first controlling circuit board, and that is disposed inside the housing on an opposite side of the first controlling circuit board from the power module such that outer circumferential edge portions thereof are held, wherein: an inner plane of the first controlling circuit board is fixed to the cooler or the housing by a first fixing member on an opposite side of the first controlling circuit board from the second controlling circuit board; an inner plane of the second controlling circuit board is fixed to the housing by a second fixing member on an opposite side of the second controlling circuit board from the first controlling circuit board; and the first controlling circuit board and the second controlling circuit board are electrically connected on facing inner planes of the first controlling circuit board and the second controlling circuit board.

Effects of the Invention

According to the present invention, the first controlling circuit board and the second controlling circuit board are electrically connected on facing inner planes of the first controlling circuit board and the second controlling circuit board. Thus, because circuits for gathering signals to one side of the first controlling circuit board and the second controlling circuit board are no longer required, parts can be mounted on the first controlling circuit board and the second controlling circuit board efficiently, enabling the first controlling circuit board and the second controlling circuit board to be reduced in size.

The first controlling circuit board and the second controlling circuit board are fixed to the cooler or the housing using different fixing members. Thus, the position of fixing of the first controlling circuit board within the inner plane can be set independently from the position of fixing of the second controlling circuit board within the inner plane. Similarly, the position of fixing of the second controlling circuit board within the inner plane can be set independently from the position of fixing of the first controlling circuit board within the inner plane. Because the position of fixing of the first controlling circuit board and the position of fixing of the second controlling circuit board can be set independently in this manner, even if the positions of the antinodes of vibration of the first controlling circuit board and the second controlling circuit board, which are held by holding portions at outer circumferential edge portions thereof, do not coincide, the fixing members can be disposed at the respective positions of the antinodes of vibration of the first controlling circuit board and the second controlling circuit board, increasing vibration resistance of the first controlling circuit board and the second controlling circuit board. In addition, because the position of fixing of the first controlling circuit board and the position of fixing of the second controlling circuit board can be set independently, parts can be mounted to the first controlling circuit board and the second controlling circuit board freely, enabling high-density mounting. Because the first controlling circuit board and the second controlling circuit board can be reduced in size in this manner, and the housing can also be reduced in size, the electric power converting apparatus can be reduced in size. The resonant frequencies of the first controlling circuit board and the second controlling circuit board are raised by the reductions in size of the first controlling circuit board and the second controlling circuit board, increasing the vibration resistance of the first and second controlling circuit boards. The resonant frequency of the housing also rises due to the reduction in size of the housing, increasing vibration resistance.

DESCRIPTION OF EMBODIMENTS

Embodiment 1

Figure 1:
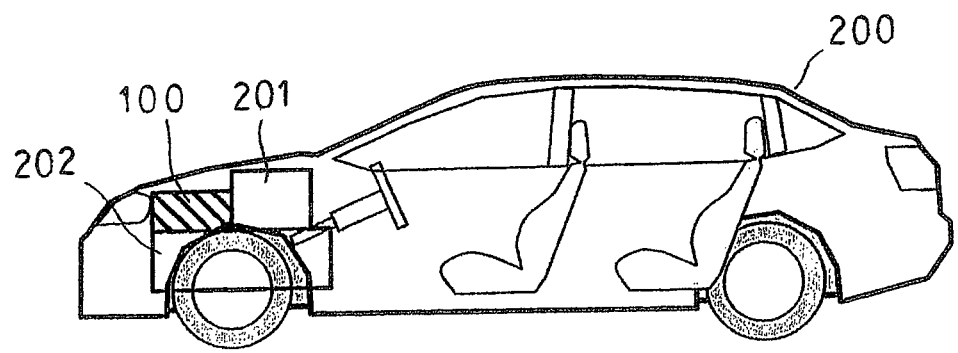
FIG. 1 is a schematic diagram that shows an automobile to which is mounted an electric power converting apparatus according to Embodiment 1 of the present invention.
Figure 2:
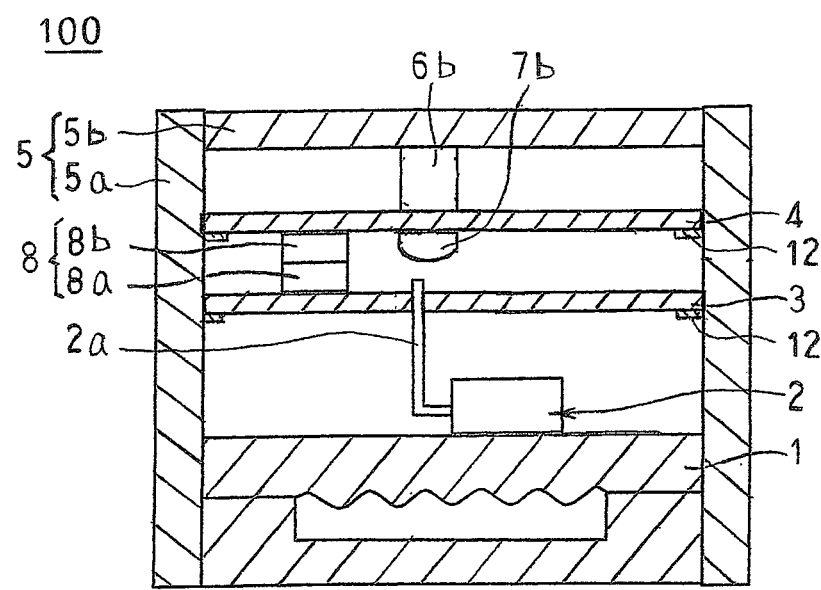
FIG. 2 is a cross section that schematically shows a construction of the electric power converting apparatus according to Embodiment 1 of the present invention.
Figure 3:
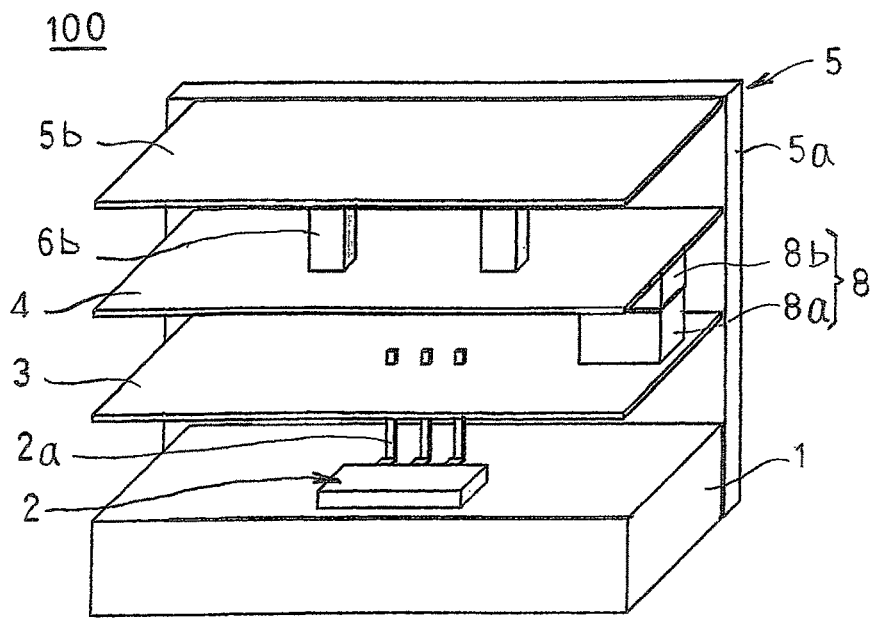
FIG. 3 is a transparent oblique projection that schematically shows the construction of the electric power converting apparatus according to Embodiment 1 of the present invention.

FIG. 1 is a schematic diagram that shows an automobile to which is mounted an electric power converting apparatus according to Embodiment 1 of the present invention, FIG. 2 is a cross section that schematically shows a construction of the electric power converting apparatus according to Embodiment 1 of the present invention, and FIG. 3 is a transparent oblique projection that schematically shows the construction of the electric power converting apparatus according to Embodiment 1 of the present invention.

As shown in FIG. 1, an electric power converting apparatus 100 is mounted above a transaxle 202 inside an engine compartment on which vibrational loads from an engine 201 of an automobile 200 and from a road surface easily act, for example.

Next, configuration of the electric power converting apparatus 100 will be explained with reference to FIGS. 2 and 3.

The electric power converting apparatus 100 includes: a power module 2 that incorporates a plurality of power semiconductors; a cooler 1 onto which the power module 2 is mounted; a first controlling circuit board 3 that is electrically connected to the power module 2 by means of signal terminals 2a, and that is disposed on an opposite side of the power module 2 from the cooler 1; a second controlling circuit board 4 that is electrically connected to the first controlling circuit board 3, and that is disposed on an opposite side of the first controlling circuit board 3 from the power module 2; and a housing 5 that houses the cooler 1 to which the power module 2 is mounted, the first controlling circuit board 3, and the second controlling circuit board 4. The housing 5 is constituted by: peripheral wall portions 5a in which the cooler 1, the first controlling circuit board 3, the second controlling circuit board 4, etc., are housed; and a cover portion 5b that is removably mounted to the peripheral wall portions 5a, and that closes an upper portion opening of the peripheral wall portions 5a, the housing being configured by fixing the cover portion 5b to the peripheral wall portions 5a using screws, etc. Holding portions 12 for the first controlling circuit board 3 and the second controlling circuit board 4 are formed so as to protrude outward from inner wall surfaces of the peripheral wall portions 5a so as to line up circumferentially into a frame shape.

The cooler 1 is produced using copper or aluminum, etc., which have good thermal conductivity, and a refrigerant may be circulated internally, if required.

The power module 2 is bonded to the upper surface of the cooler 1 mechanically using a good thermally conducting material such as a solder, a sintered material of silver nanoparticles, a liquid phase diffusion binder such as copper-tin (Cu—Sn), silver-tin (Ag—Sn), etc., or a heat-conducting sheet, etc. Moreover, although not shown, parts such as electric reactors, capacitors, etc., that are necessary for the electric power converting apparatus 100 may be mounted to the cooler 1.

The first controlling circuit board 3 includes a driving circuit that controls switching operation of the power module 2, for example, and is disposed above the cooler 1 such that outer circumferential edge portion are held by the peripheral wall portions 5a. The signal terminals 2a of the power module 2 are electrically connected and mechanically fixed to the first controlling circuit board 3 so as to be joined to through-holes of the first controlling circuit board 3 by solder, etc. An inner plane of the first controlling circuit board 3 is thereby fixed to the cooler 1 by means of the power module 2.

The second controlling circuit board 4 includes a microcomputer, determines an operating mode based on input signals from outside the electric power converting apparatus 100, including various signals such as signals from a rotational position sensor and a temperature sensor of the electric motor, rotational speed of the engine, for example, and controls driving of the electric motor based on the result of that determination. The second controlling circuit board 4 is disposed above the first controlling circuit board 3 such that outer circumferential edge portions are held by the peripheral wall portions 5a. In addition, an inner plane of the second controlling circuit board 4 is fixed mechanically to the cover portion 5b, in other words, the housing 5, by being fixed by screws 7a to second supporting posts 6b that are fixed by screws (not shown) to a lower surface of the cover portion 5b. The second supporting posts 6b should be able to support the second controlling circuit board 4 on the cover portion 5b, and have a cross-sectional shape that is triangular, quadrangular, pentagonal, hexagonal, circular, or elliptical, for example.

An electrical connection portion 8 is constituted by: a pin socket 8a that is mounted to an inner plane of an upper surface of the first controlling circuit board 3; and a pin header 8b that is mounted to an inner plane of a lower surface of the second controlling circuit board 4 at a position that faces the pin socket 8a, for example. Moreover, "inner plane" means a region of the first controlling circuit board 3 or the second controlling circuit board 4 that excludes a perimeter portion, and refers to portions of dimensions of each of the first controlling circuit board 3 and the second controlling circuit board 4 that exclude an outer circumferential edge portion in a range of 10 percent from each edge, for example. Furthermore, the first controlling circuit board 3 and the second controlling circuit board 4 may be produced so as to have identical dimensions, or may be produced such that the first controlling circuit board 3 is greater than the second controlling circuit board 4, or may be produced such that the first controlling circuit board 3 is smaller than the second controlling circuit board 4.

To assemble the electric power converting apparatus 100 that is configured in this manner, first the cooler 1, to the upper surface of which the power module 2 is mounted, the first controlling circuit board 3, to the upper surface of which the pin socket 8a is mounted, and the second controlling circuit board 4, to the lower surface of which the pin header 8b is mounted, are prepared. Then, the first controlling circuit board 3 is fixed to the cooler 1 so as to have the power module 2 interposed by joining the signal terminals 2a of the power module 2 to the through-holes of the first controlling circuit board 3. The second supporting posts 6b are also fixed by screws 7a to the inner plane of the upper surface of the second controlling circuit board 4.

Next, the cooler 1 is housed inside the peripheral wall portions 5a such that the first controlling circuit board 3 is above, and the cooler 1 is fixed to the peripheral wall portions 5a by screws (not shown). The outer circumferential edge portions of the first controlling circuit board 3 are also mounted onto the holding portions 12, and are fixed to the holding portions 12 by screws (not shown). Next, the outer circumferential edge portions of the second controlling circuit board 4 are mounted onto the holding portions 12 from above, are fixed to the holding portions 12 by screws (not shown). The pin header 8b is thereby inserted into the pin socket 8a, such that the second controlling circuit board 4 is electrically connected to the first controlling circuit board 3. In addition, the cover portion 5b is placed from above so as to close the upper portion opening of the peripheral wall portions 5a, the second supporting posts 6b are fixed to the cover portion 5b by screws (not shown), and the cover portion 5b is also fixed by screws (not shown) to the peripheral wall portions 5a, to assemble the electric power converting apparatus 100.

In the electric power converting apparatus 100 that is assembled in this manner, the first controlling circuit board 3 is fixed to the cooler 1 by being joined to the signal terminals 2a of the power module 2. The second controlling circuit board 4 is also fixed to the cover portion 5b by being fixed by fastening to the second supporting posts 6b. Consequently, because the first controlling circuit board 3 and the second controlling circuit board 4 can be fixed without using the circuit board holding bracket that was required in Patent Literature 1, the number of parts is reduced, increasing productivity.

The inner plane of the first controlling circuit board 3 is fixed to the cooler 1 by the signal terminals 2a of the power module 2, which constitute a first fixing member, and the inner plane of the second controlling circuit board 4 is fixed to the cover portion 5b by the second supporting posts 6b, which constitute a second fixing member. In other words, the inner planes of the first controlling circuit board 3 and the second controlling circuit board 4 are fixed to the cooler 1 and the housing 5, respectively, by different fixing members, and are not fixed by an identical fixing member that passes through the two circuit boards, as in Patent Literature 2. Because the mechanical fixed position on the inner plane of the first controlling circuit board 3 can be set arbitrarily, regardless of the mechanical fixed position on the inner plane of the second controlling circuit board 4, surface mounted components can be disposed freely on the inner plane of the first controlling circuit board 3. Similarly, because the mechanical fixed position on the inner plane of the second controlling circuit board 4 can be set arbitrarily, regardless of the mechanical fixed position on the inner plane of the first controlling circuit board 3, surface mounted components can be disposed freely on the inner plane of the second controlling circuit board 4. Consequently, because parts can be disposed freely on the first controlling circuit board 3 and the second controlling circuit board 4, high-density mounting of the first controlling circuit board 3 and the second controlling circuit board 4 is made possible, enabling the first controlling circuit board 3 and the second controlling circuit board 4 to be reduced in size. By reducing the first controlling circuit board 3 and the second controlling circuit board 4 in size, the resonant frequency of the first controlling circuit board 3 and second controlling circuit board 4 is raised.

Because the resonant frequency of the first controlling circuit board 3 and second controlling circuit board 4 is raised in this manner, even if vehicle vibration acts on the electric power converting apparatus 100, and the first controlling circuit board 3 and the second controlling circuit board 4 resonate, displacement amplitude of the first controlling circuit board 3 and the second controlling circuit board 4 is reduced, reducing strain that arises in the first controlling circuit board 3 and the second controlling circuit board 4. Because the occurrence of damage to parts that are mounted to the first controlling circuit board 3 and the second controlling circuit board 4 is thereby suppressed, vibration resistance of the first controlling circuit board 3 and the second controlling circuit board 4 is improved. If the spacings of the fixed portions when the first controlling circuit board 3 and the second controlling circuit board 4 are fixed mechanically by their inner planes is half the spacings of the fixed portions when the first controlling circuit board 3 and the second controlling circuit board 4 are fixed mechanically by only their outer circumferential edge portions, for example, then the resonant frequencies of the first controlling circuit board 3 and the second controlling circuit board 4 are multiplied by four.

Because the cover portion 5b is fixed to the second controlling circuit board 4 so as to have the second supporting posts 6b interposed, the resonant frequency of the cover portion 5b is raised, enabling vibration resistance of the cover portion 5b to be increased. If the spacing of the fixed portion when the second controlling circuit board 4 is fixed mechanically to the cover portion 5b by its inner plane is half the spacing of the fixed portion when the second controlling circuit board 4 is fixed mechanically to the cover portion 5b by only its outer circumferential edge portions, for example, then the resonant frequency of the cover portion 5b is multiplied by four.

Because electrical connection between the first controlling circuit board 3 and the second controlling circuit board 4 is performed on facing inner planes of the first controlling circuit board 3 and the second controlling circuit board 4, circuits for gathering signals to one side of the first controlling circuit board 3 and the second controlling circuit board 4, which were required in Patent Literature 1, are no longer required, enabling the first controlling circuit board 3 and the second controlling circuit board 4 to be reduced in size. Because the first controlling circuit board 3 and the second controlling circuit board 4 can be reduced in size in this manner, the resonant frequencies of the first controlling circuit board 3 and the second controlling circuit board 4 are raised, enabling vibration resistance of the first controlling circuit board 3 and the second controlling circuit board 4 to be improved. In addition, because reductions in the size of the housing 5 can be achieved together with the reductions in the size of the first controlling circuit board 3 and the second controlling circuit board 4, the resonant frequency of the housing 5 is raised, enabling vibration resistance of the housing 5 to be increased.

Because the pin socket 8a and the pin header 8b are used in the electrical connection portion 8 that electrically connects the first controlling circuit board 3 and the second controlling circuit board 4, the first controlling circuit board 3 and the second controlling circuit board 4 can be connected electrically simply by stacking the second controlling circuit board 4 from above onto the first controlling circuit board 3 that is housed inside the peripheral wall portions 5a, increasing productivity.

Because, the inner planes of the first controlling circuit board 3 and the second controlling circuit board 4 are fixed to the cooler 1 and the housing 5, respectively, by different fixing members, the position of fixing on the inner plane of the first controlling circuit board 3 and the position of fixing on the inner plane of the second controlling circuit board 4 can be set independently. In Embodiment 1, a central position of the first controlling circuit board 3 is fixed by the signal terminals 2a of the power module 2, as shown in FIG. 3. A position of an antinode of a fundamental vibration of the first controlling circuit board 3 in which outer circumferential edge portions are held by the holding portions 12 is thereby fixed by the signal terminals 2a, enabling the vibration resistance of the first controlling circuit board 3 to be increased. Similarly, as shown in FIG. 3, a position of an antinode of a double vibration of the second controlling circuit board 4 in which outer circumferential edge portions are held by the holding portions 12 is fixed by the second supporting posts 6b, enabling the vibration resistance of the second controlling circuit board 4 to be increased.

Moreover, in Embodiment 1 above, the first controlling circuit board 3 and the second controlling circuit board 4 are connected electrically using the pin socket 8a and the pin header 8b, but the first controlling circuit board 3 and the second controlling circuit board 4 may be connected electrically using a connector and harness. In that case, first the cooler 1, to the upper surface of which the power module 2 is mounted, the first controlling circuit board 3, to the upper surface of which the connector is mounted, and the second controlling circuit board 4, to the lower surface of which the harness is mounted, are prepared. Then, the inner plane of the first controlling circuit board 3 is fixed to the cooler 1 so as to have the power module 2 interposed by joining the signal terminals 2a of the power module 2 to the throughholes of the first controlling circuit board 3. The second supporting posts 6b are also fixed by screws 7a to the inner plane of the second controlling circuit board 4. Next, the cooler 1 is housed inside the peripheral wall portions 5a such that the first controlling circuit board 3 is above, the cooler 1 is fixed to the peripheral wall portions 5a, and the outer circumferential edge portions of the first controlling circuit board 3 are also fixed to the holding portions 12 that are formed on the peripheral wall portions 5a by screws. Next, the harness is fitted into the connector that is mounted to the first controlling circuit board 3, the second controlling circuit board 4 is housed inside the peripheral wall portions 5a so as to be stacked above the first controlling circuit board 3, and the outer circumferential edge portions of the second controlling circuit board 4 are also fixed by screws to the holding portions 12 that are formed on the peripheral wall portions 5a. In addition, the cover portion 5b is placed so as to close the upper portion opening of the peripheral wall portions 5a, the second supporting posts 6b are fixed to the cover portion 5b by screws, and the cover portion 5b is also fixed by screws to the peripheral wall portions 5a, to assemble an electric power converting apparatus.

In Embodiment 1 above, the second controlling circuit board 4 is fixed to the cover portion 5b by means of the second supporting posts 6b, but the second controlling circuit board 4 may be fixed to the peripheral wall portions 5a by means of second supporting posts 6b.

In Embodiment 1 above, a single power module 2 is mounted to the cooler 1, but the number of power modules 2 that are mounted to the cooler 1 may alternatively be two or more. In that case, the plurality of power modules 2 that are mounted to the cooler 1 may have identical shapes, or may have different shapes.

In Embodiment 1 above, the pin socket 8a is mounted to the first controlling circuit board 3, and the pin header 8b is mounted to the second controlling circuit board 4, but the pin socket 8a may be mounted to the second controlling circuit board 4, and the pin header 8b mounted to the first controlling circuit board 3.

In Embodiment 1 above, the second supporting posts 6b are fixed to the cover portion 5b by screws, but the second supporting posts 6b may be fixed to the cover portion 5b using a solder, a sintered material of silver nanoparticles, a liquid phase diffusion binder such as copper-tin, silver-tin, etc., or an adhesive, etc.

In Embodiment 1 above, the second controlling circuit board 4 is fixed to the second supporting posts 6b by screws 7a, but the second controlling circuit board 4 may be fixed to the second supporting posts 6b using a solder, a sintered material of silver nanoparticles, a liquid phase diffusion binder such as copper-tin, silver-tin, etc., or an adhesive, etc.

In Embodiment 1 above, the outer circumferential edge portions of the first controlling circuit board 3 and the second controlling circuit board 4 are held by the peripheral wall portions 5a, but the outer circumferential edge portions of the first controlling circuit board 3 and the second controlling circuit board 4 may be held by the cooler 1. In that case, the holding portions 12 are produced as separate members from the housing 5, and those holding portions 12 should be supported by supporting posts that are disposed so as to stand on the cooler 1. Here, because the supporting posts that support the holding portions for the second controlling circuit board 4 pass through the outer circumferential edge portions of the first controlling circuit board 3, the packing density of the first controlling circuit board 3 will not decrease.

Embodiment 2

Figure 4:
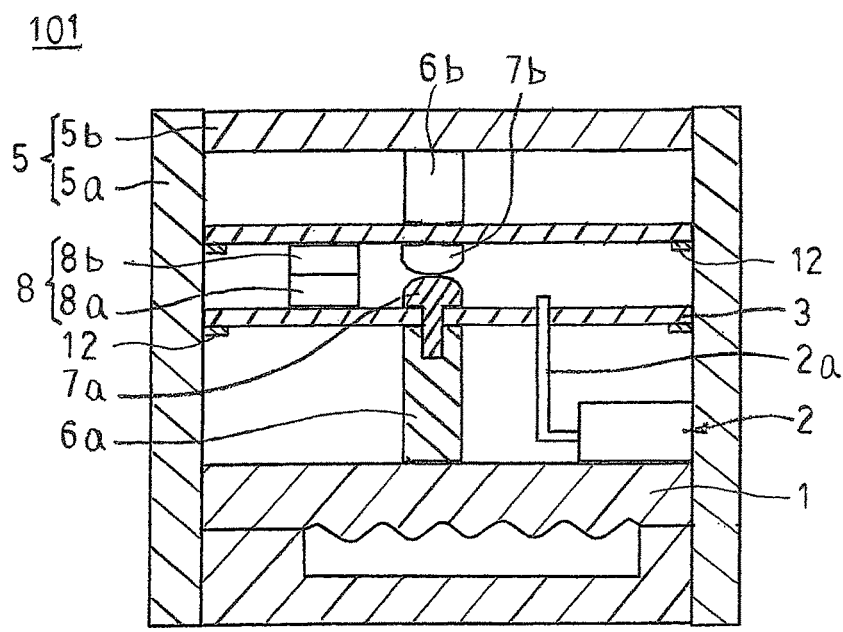
FIG. 4 is a cross section that schematically shows a construction of an electric power converting apparatus according to Embodiment 2 of the present invention.
Figure 5:
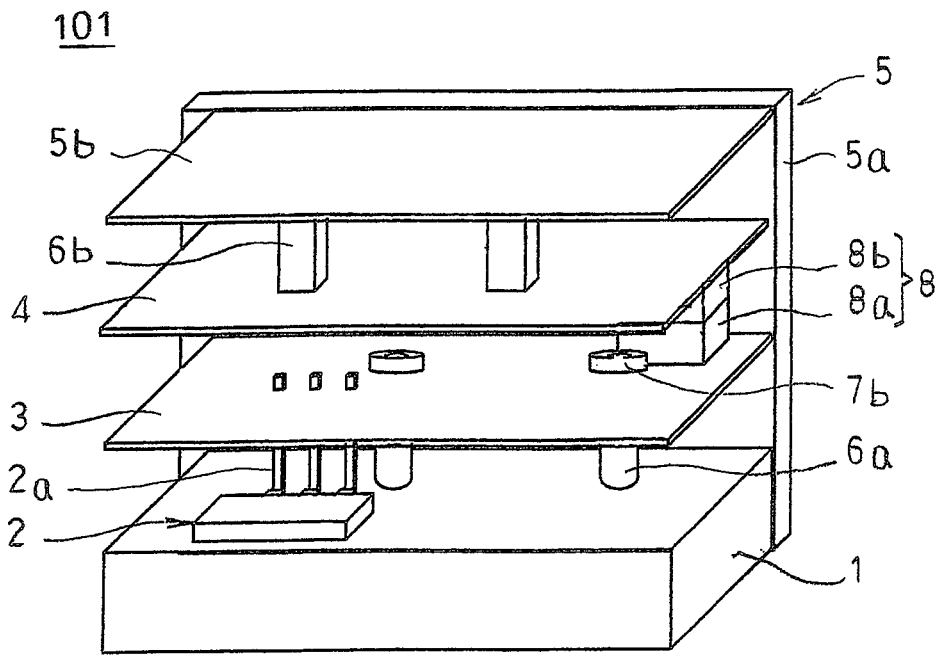
FIG. 5 is a transparent oblique projection that schematically shows the construction of the electric power converting apparatus according to Embodiment 2 of the present invention.

FIG. 4 is a cross section that schematically shows a construction of an electric power converting apparatus according to Embodiment 2 of the present invention, and FIG. 5 is a transparent oblique projection that schematically shows the construction of the electric power converting apparatus according to Embodiment 2 of the present invention.

In FIGS. 4 and 5, first supporting posts 6a are fixed to an upper surface of a cooler 1 using a solder, a sintered material of silver nanoparticles, a liquid phase diffusion binder such as copper-tin, silver-tin, etc., an adhesive, or screws, etc. A first controlling circuit board 3 is fixed to the cooler 1 by means of the first supporting posts 6a by being fixed by screws 7b to the first supporting posts 6a, The first supporting posts 6a constitute a first fixing member.

Moreover, a remainder of the configuration is configured in a similar or identical manner to that of Embodiment 1 above.

In an electric power converting apparatus 101 according to Embodiment 2, the inner plane of the first controlling circuit board 3 is fixed to the cooler 1 by means of the first supporting posts 6a, and the inner plane of the second controlling circuit board 4 is fixed to the cover portion 5b by means of the second supporting posts 6b. In addition, electrical connection between the first controlling circuit board 3 and the second controlling circuit board 4 is performed on the inner planes of the first controlling circuit board 3 and the second controlling circuit board 4. Consequently, similar or identical effects to those in Embodiment 1 above can also be achieved in Embodiment 2.

In Embodiment 2, because a central position of the first controlling circuit board 3 is fixed by the first supporting posts 6a, a position of an antinode of a fundamental vibration of the first controlling circuit board 3 in which outer circumferential edge portions are held by the holding portions 12 is fixed by the first supporting posts 6a, also enabling the vibration resistance of the first controlling circuit board 3 to be increased. A position of an antinode of a double vibration of the second controlling circuit board 4 in which outer circumferential edge portions are held by the holding portions 12 is also fixed by the second supporting posts 6b, enabling the vibration resistance of the second controlling circuit board 4 to be increased.

According to Embodiment 2, because the first controlling circuit board 3 is fixed to the cooler 1 by means of not only the signal terminals 2a of the power module 2 but also the first supporting posts 6a, the first controlling circuit board 3 is fixed to the cooler 1 more firmly. Vibration resistance of the first controlling circuit board 3 can thereby be increased.

Because the first controlling circuit board 3 is fixed to the cooler 1 by means of the first supporting posts 6a, it becomes possible to omit mechanical fixing between the first controlling circuit board 3 and the signal terminals 2a of the power module 2. Thus, if a snap-fit coupling that enables mounting and removal is used in the electrical connection between the first controlling circuit board 3 and the signal terminals 2a of the power module 2, the first controlling circuit board 3 can be removed after assembly of the electric power converting apparatus 101, improving serviceability. In addition, if the power module 2 is fixed to the cooler 1 removably by screws, etc., the power module 2 alone can be removed from the cooler 1 and the first controlling circuit board 3 when a failure of the power module 2 is found at shipping inspection during the manufacturing process, improving yield, and also enabling reductions in cost to be achieved.

Moreover, in Embodiment 2 above, the first supporting posts 6a are fixed to the cooler 1, but because it is not necessary for the first supporting posts 6a to be cooled, they alternatively may be fixed to the peripheral wall portions 5a. In other words, the inner plane of the first controlling circuit board 3 may alternatively be fixed to the housing 5 by means of first supporting posts 6a.

In Embodiment 2 above, the first controlling circuit board 3 is mounted removably to the first supporting posts 6a by screws 7a, but if it is not necessary for the first controlling circuit board 3 to be mounted to the first supporting posts 6a removably, the first controlling circuit board 3 may be fixed to the first supporting posts 6a using a solder, a sintered material of silver nanoparticles, a liquid phase diffusion binder such as copper-tin, silver-tin, etc., or an adhesive, etc.

Embodiment 3

Figure 6:
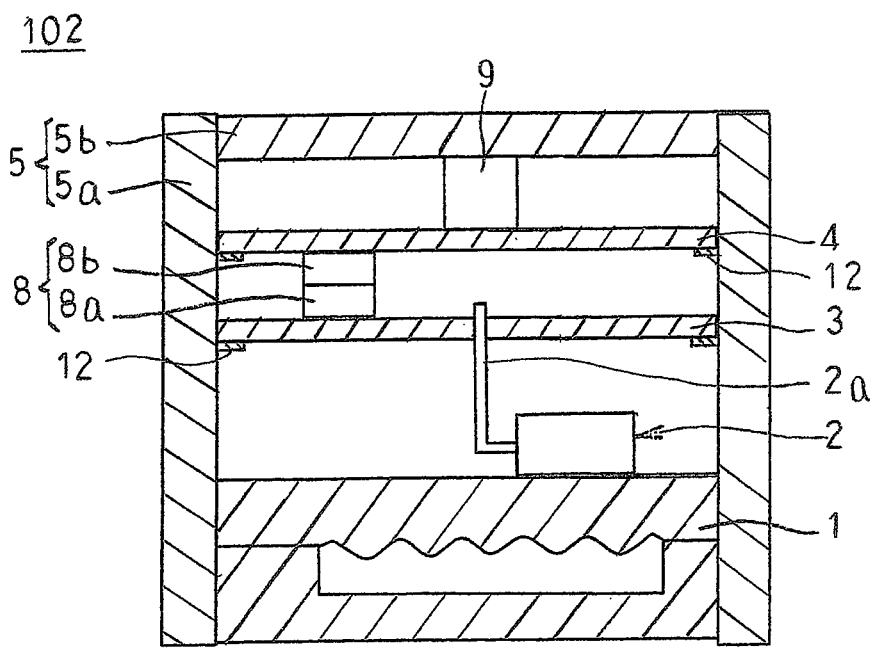
FIG. 6 is a cross section that schematically shows a construction of an electric power converting apparatus according to Embodiment 3 of the present invention.
Figure 7:
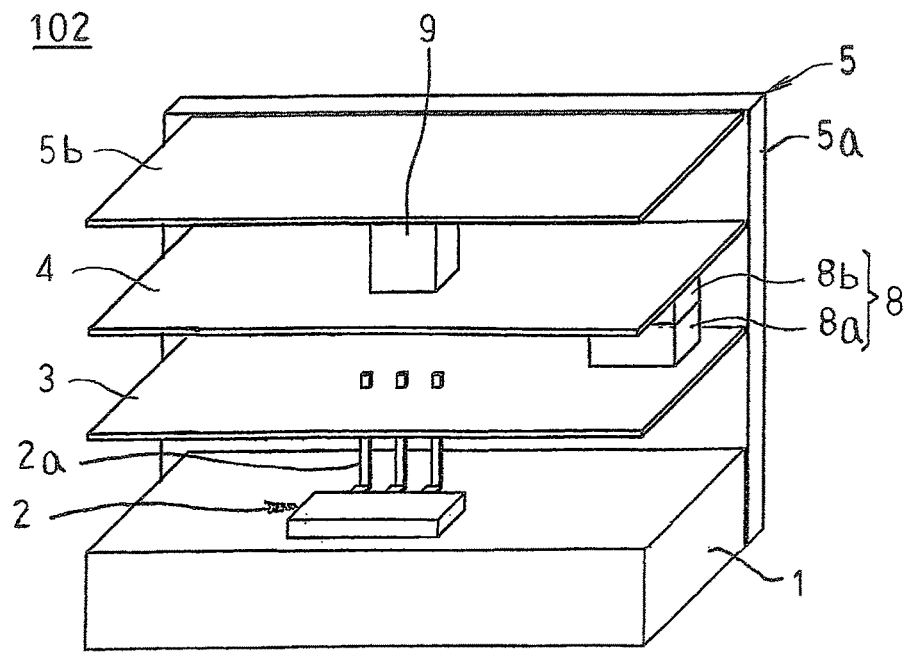
FIG. 7 is a transparent oblique projection that schematically shows the construction of the electric power converting apparatus according to Embodiment 3 of the present invention.

FIG. 6 is a cross section that schematically shows a construction of an electric power converting apparatus according to Embodiment 3 of the present invention, and FIG. 7 is a transparent oblique projection that schematically shows the construction of the electric power converting apparatus according to Embodiment 3 of the present invention.

In FIGS. 6 and 7, surface mounted components 9 that are mounted to an inner plane of a second controlling circuit board 4 are fixed to a lower surface of the cover portion 5b by adhesive. The surface mounted components 9 constitute a second fixing member.

Moreover, a remainder of the configuration is configured in a similar or identical manner to that of Embodiment 1 above.

In an electric power converting apparatus 102 according to Embodiment 3, the first controlling circuit board 3 is fixed to the cooler 1 by means of the signal terminals 2a of the power module 2, and the second controlling circuit board 4 is fixed to the cover portion 5b by means of the surface mounted components 9. In addition, electrical connection between the first controlling circuit board 3 and the second controlling circuit board 4 is performed on the inner planes of the first controlling circuit board 3 and the second controlling circuit board 4. Consequently, similar or identical effects to those in Embodiment 1 above can also be achieved in Embodiment 3.

According to Embodiment 3, because the second controlling circuit board 4 and the cover portion 5b are fixed together mechanically using the surface mounted components 9 on the second controlling circuit board 4, second supporting posts 6b become unnecessary. Thus, because portions of the second controlling circuit board 4 where the second supporting posts 6b were fixed can be utilized as mounting space for parts, the second controlling circuit board 4 can be reduced in size. The resonant frequency of the second controlling circuit board 4 is then raised due to reductions in size of the second controlling circuit board 4, improving vibration resistance of the second controlling circuit board 4.

In Embodiment 3, because a central position of the first controlling circuit board 3 is fixed by the signal terminals 2a of the power module 2, a position of an antinode of a fundamental vibration of the first controlling circuit board 3 in which outer circumferential edge portions are held by the holding portions 12 is fixed by the signal terminals 2a of the power module 2, also enabling the vibration resistance of the first controlling circuit board 3 to be increased. Because a central position of the second controlling circuit board 4 is fixed by the surface mounted components 9, a position of an antinode of a fundamental vibration of the second controlling circuit board 4 in which outer circumferential edge portions are held by the holding portions 12 is also fixed by the surface mounted components 9, enabling the vibration resistance of the second controlling circuit board 4 to be increased.

Moreover, in Embodiment 3 above, the surface mounted components 9 are fixed to the cover portion 5b using adhesive, and it is desirable to use an adhesive that has a low curing temperature so as to allow for heat resistance of the surface mounted components 9.

Embodiment 4

Figure 8:
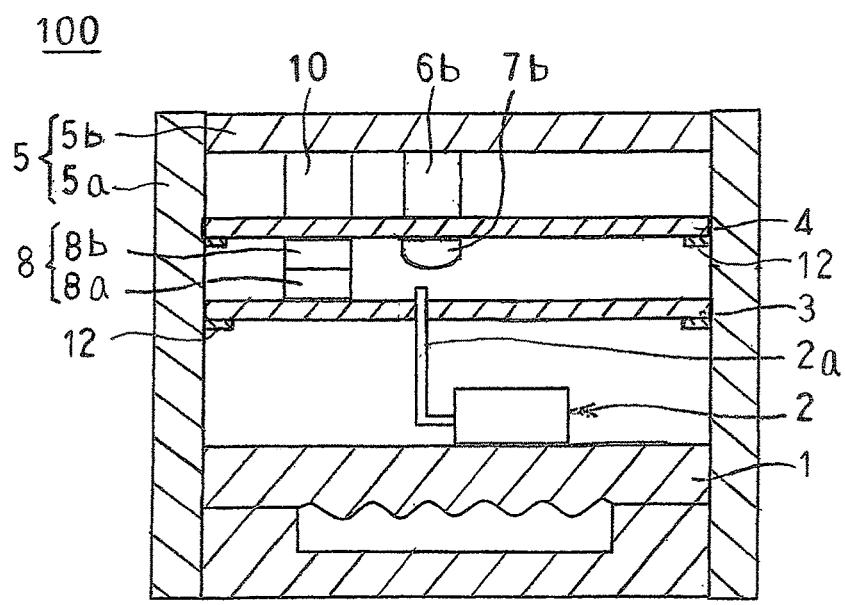
FIG. 8 is a cross section that schematically shows a construction of an electric power converting apparatus according to Embodiment 4 of the present invention.
Figure 9:
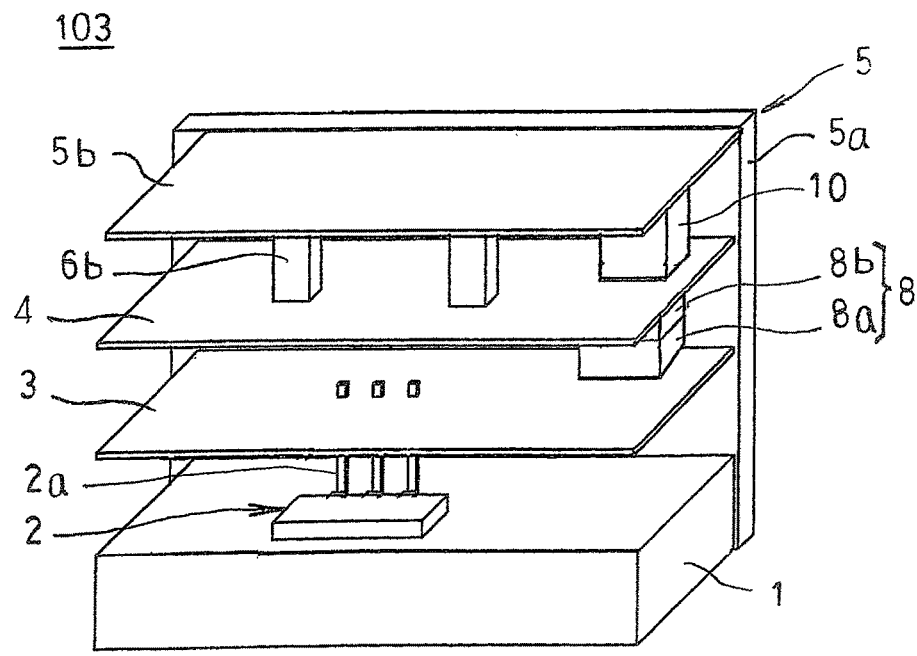
FIG. 9 is a transparent oblique projection that schematically shows the construction of the electric power converting apparatus according to Embodiment 4 of the present invention.

FIG. 8 is a cross section that schematically shows a construction of an electric power converting apparatus according to Embodiment 4 of the present invention, and FIG. 9 is a transparent oblique projection that schematically shows the construction of the electric power converting apparatus according to Embodiment 4 of the present invention.

In FIGS. 8 and 9, a reinforcing member 10 is disposed between a cover portion 5b and a position on a second controlling circuit board 4 above a portion where a pin header 8b is mounted.

Moreover, a remainder of the configuration is configured in a similar or identical manner to that of Embodiment 1 above.

In an electric power converting apparatus 103 according to Embodiment 4, the first controlling circuit board 3 is fixed to the cooler 1 by means of the signal terminals 2a of the power module 2, and the second controlling circuit board 4 is fixed to the cover portion 5b by means of the second supporting posts 6b. In addition, electrical connection between the first controlling circuit board 3 and the second controlling circuit board 4 is performed on the inner planes of the first controlling circuit board 3 and the second controlling circuit board 4. Consequently, similar or identical effects to those in Embodiment 1 above can also be achieved in Embodiment 4.

In Embodiment 4, the reinforcing member 10 is produced using a resin material that has elasticity, such as a silicone rubber, etc., or a metal material that has elasticity, such as a spring, etc., so as to have a natural length that is slightly longer than a length of the second supporting posts 6b. Thus, when the second supporting posts 6b are fixed to the cover portion 5b during assembly of the electric power converting apparatus 103, the reinforcing member 10 is pressed and held between the second controlling circuit board 4 and the cover portion 5b and deforms elastically, and a repulsive force therefrom acts through the second controlling circuit board 4 so as to press the pin socket 8a into the pin header 8b. Consequently, even if vibration acts on the electric power converting apparatus 103, the occurrence of situations such as the pin socket 8a being disengaged from the pin header 8b is suppressed, improving reliability of the electrical connection between the first and second controlling circuit boards 3 and 4.

Because vibrational energy is absorbed by the reinforcing member 10, even if vibration acts on the electric power converting apparatus 103 from a vehicle, amplitude in the second controlling circuit board 4 is reduced, improving vibration resistance of the second controlling circuit board 4.

In Embodiment 4, because a central position of the first controlling circuit board 3 is fixed by the signal terminals 2a of the power module 2, a position of an antinode of a fundamental vibration of the first controlling circuit board 3 in which outer circumferential edge portions are held by the holding portions 12 is fixed by the signal terminals 2a of the power module 2, also enabling the vibration resistance of the first controlling circuit board 3 to be increased. A position of an antinode of a double vibration of the second controlling circuit board 4 in which outer circumferential edge portions are held by the holding portions 12 is also fixed by the second supporting posts 6b, enabling the vibration resistance of the second controlling circuit board 4 to be increased.

Embodiment 5

Figure 10:
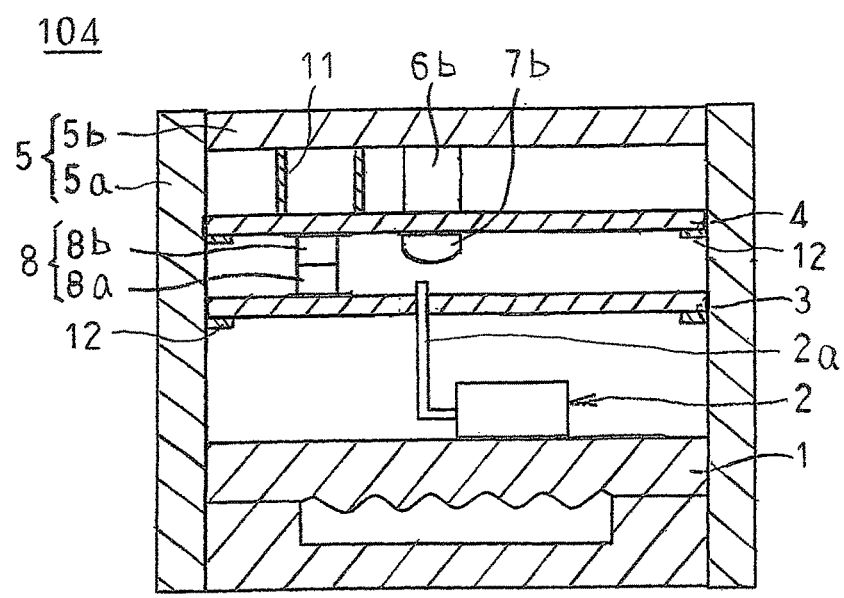
FIG. 10 is a cross section that schematically shows a construction of an electric power converting apparatus according to Embodiment 5 of the present invention.
Figure 11:
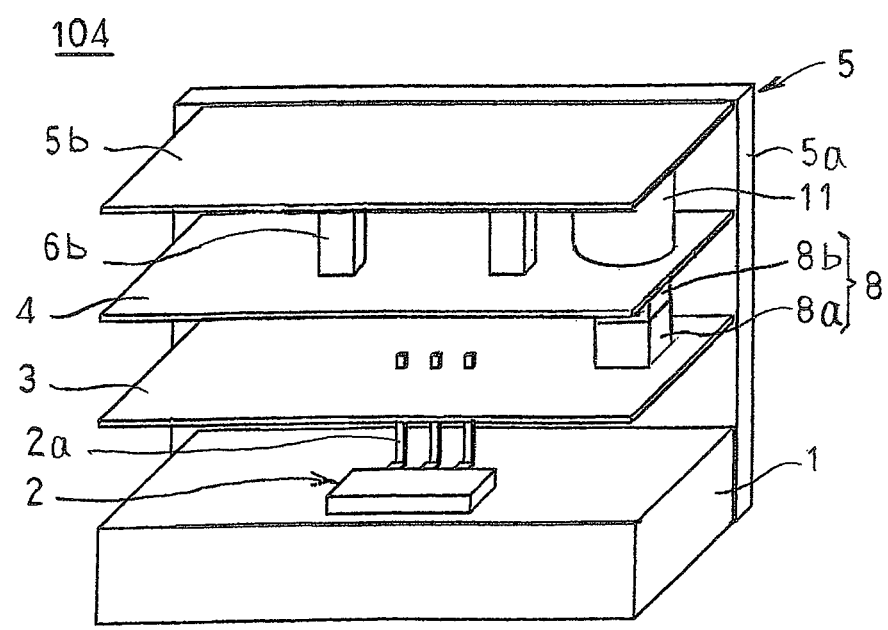
FIG. 11 is a transparent oblique projection that schematically shows the construction of the electric power converting apparatus according to Embodiment 5 of the present invention.

FIG. 10 is a cross section that schematically shows a construction of an electric power converting apparatus according to Embodiment 5 of the present invention, and FIG. 11 is a transparent oblique projection that schematically shows the construction of the electric power converting apparatus according to Embodiment 5 of the present invention.

In FIGS. 10 and 11, a reinforcing member 11 is disposed between a cover portion 5b and a position on a second controlling circuit board 4 above a portion where a pin header 8b is mounted. The reinforcing member 11 is formed into a hollow body that surrounds a pin socket 8a when viewed from a direction that is perpendicular to an inner plane of the second controlling circuit board 4.

Moreover, a remainder of the configuration is configured in a similar or identical manner to that of Embodiment 1 above.

In an electric power converting apparatus 104 according to Embodiment 5, the first controlling circuit board 3 is fixed to the cooler 1 by means of the signal terminals 2a of the power module 2, and the second controlling circuit board 4 is fixed to the cover portion 5b by means of the second supporting posts 6b. In addition, electrical connection between the first controlling circuit board 3 and the second controlling circuit board 4 is performed on the inner planes of the first controlling circuit board 3 and the second controlling circuit board 4. Consequently, similar or identical effects to those in Embodiment 1 above can also be achieved in Embodiment 5.

In Embodiment 5, the reinforcing member 11 is produced into a hollow body that has an axial length that is slightly longer than a length of the second supporting posts 6b using a material such as a ceramic, etc., that is harder than the second controlling circuit board 4, and is disposed so as to surround the pin socket 8a when viewed from a direction that is perpendicular to the inner plane of the second controlling circuit board 4. Thus, when the second supporting posts 6b are fixed to the cover portion 5b during assembly of the electric power converting apparatus 104, the second controlling circuit board 4 is subjected to a load toward the first controlling circuit board 3 from the cover portion 5b by means of the reinforcing member 11 and deforms elastically. This elastic deformation of the second controlling circuit board 4 toward the first controlling circuit board 3 acts through the second controlling circuit board 4 so as to press the pin socket 8a into the pin header 8b. Consequently, even if vibration acts on the electric power converting apparatus 104, the occurrence of situations such as the pin socket 8a being disengaged from the pin header 8b is suppressed, improving reliability of the electrical connection between the first controlling circuit board 3 and the second controlling circuit board 4.

In Embodiment 5, because a central position of the first controlling circuit board 3 is fixed by the signal terminals 2a of the power module 2, a position of an antinode of a fundamental vibration of the first controlling circuit board 3 in which outer circumferential edge portions are held by the holding portions 12 is fixed by the signal terminals 2a of the power module 2, also enabling the vibration resistance of the first controlling circuit board 3 to be increased. A position of an antinode of a double vibration of the second controlling circuit board 4 in which outer circumferential edge portions are held by the holding portions 12 is also fixed by the second supporting posts 6b, enabling the vibration resistance of the second controlling circuit board 4 to be increased.

Moreover, in each of the above embodiments, material properties, materials, and conditions of implementation of respective components, etc., are also described, but these are examples, and are not limited to those described.

In the present invention, free combination of each of the above embodiments, and modification of any component in any of the above embodiments, or omission of any component in any of the above embodiments, are possible within the scope of the invention.

In each of the above embodiments, cases in which the electric power converting apparatus is mounted to an automobile have been explained, but the electric power converting apparatus can be applied to any application in which vibration resistance is required, such as electric trains, ships, aircraft, etc.

The invention claimed is:

1. An electric power converting apparatus comprising:
   a housing;
   a cooler that is fixed to said housing, and that is disposed inside said housing;
   a power module that is mounted to said cooler;
   a first controlling circuit board that is electrically connected to said power module, and that is disposed inside said housing on an opposite side of said power module from said cooler such that outer circumferential edge portions thereof are held; and
   a second controlling circuit board that is electrically connected to said first controlling circuit board, and that is disposed inside said housing on an opposite side of said first controlling circuit board from said power module such that outer circumferential edge portions thereof are held,
   wherein:
   an inner plane of said first controlling circuit board is fixed to said cooler or said housing by a first fixing member on an opposite side of said first controlling circuit board from said second controlling circuit board;
   an inner plane of said second controlling circuit board is fixed to said housing by a second fixing member on an opposite side of said second controlling circuit board from said first controlling circuit board; and
   said first controlling circuit board and said second controlling circuit board are electrically connected on facing inner planes of said first controlling circuit board and said second controlling circuit board.

2. The electric power converting apparatus according to claim 1, wherein an electrical connection portion between said first controlling circuit board and said second controlling circuit board is constituted by:
   a pin socket that is mounted to a first of said first controlling circuit board and said second controlling circuit board; and
   a pin header that is mounted to a second of said first controlling circuit board and said second controlling circuit board, and that is inserted into said pin socket.

3. The electric power converting apparatus according to claim 2, wherein a reinforcing member is disposed between said housing and a portion of said second controlling circuit board on an opposite side from said electrical connection portion.

4. The electric power converting apparatus according to claim 3, wherein said reinforcing member is an elastic body, and forces said second controlling circuit board in a direction that inserts said pin header into said pin socket.

5. The electric power converting apparatus according to claim 3, wherein said reinforcing member is produced into a hollow body that surrounds said pin socket when viewed from a direction that is perpendicular to said inner plane of said second controlling circuit board, and forces said pin header by means of said second controlling circuit board in a direction that inserts said pin header into said pin socket.

6. The electric power converting apparatus according to claim 1, wherein:
   said housing comprises:
   a peripheral wall portion to which said cooler is fixed; and
   a cover portion that is removably mounted to said peripheral wall portion,
   said first controlling circuit board being fixed to said cooler or said peripheral wall portion, and said second controlling circuit board being fixed to said cover portion.

7. The electric power converting apparatus according to claim 6, wherein an electrical connection portion between said first controlling circuit board and said second controlling circuit board is constituted by:
   a pin socket that is mounted to a first of said first controlling circuit board and said second controlling circuit board; and
   a pin header that is mounted to a second of said first controlling circuit board and said second controlling circuit board, and that is inserted into said pin socket.

8. The electric power converting apparatus according to claim 7, wherein a reinforcing member is disposed between said housing and a portion of said second controlling circuit board on an opposite side from said electrical connection portion.

9. The electric power converting apparatus according to claim 8, wherein said reinforcing member is an elastic body, and forces said second controlling circuit board in a direction that inserts said pin header into said pin socket.

10. The electric power converting apparatus according to claim 8, wherein said reinforcing member is produced into a hollow body that surrounds said pin socket when viewed from a direction that is perpendicular to said inner plane of said second controlling circuit board, and forces said pin header by means of said second controlling circuit board in a direction that inserts said pin header into said pin socket.

11. The electric power converting apparatus according to claim 6, wherein said first fixing member is said power module.

12. The electric power converting apparatus according to claim 6, wherein said second fixing member is a part that is mounted onto said second controlling circuit board.

13. The electric power converting apparatus according to claim 1, wherein said first fixing member is said power module.

14. The electric power converting apparatus according to claim 13, wherein an electrical connection portion between said first controlling circuit board and said second controlling circuit board is constituted by:
- a pin socket that is mounted to a first of said first controlling circuit board and said second controlling circuit board; and
- a pin header that is mounted to a second of said first controlling circuit board and said second controlling circuit board, and that is inserted into said pin socket.

15. The electric power converting apparatus according to claim 14, wherein a reinforcing member is disposed between said housing and a portion of said second controlling circuit board on an opposite side from said electrical connection portion.

16. The electric power converting apparatus according to claim 1, wherein said second fixing member is a part that is mounted onto said second controlling circuit board.

17. The electric power converting apparatus according to claim 16, wherein an electrical connection portion between said first controlling circuit board and said second controlling circuit board is constituted by:
- a pin socket that is mounted to a first of said first controlling circuit board and said second controlling circuit board; and
- a pin header that is mounted to a second of said first controlling circuit board and said second controlling circuit board, and that is inserted into said pin socket.

18. The electric power converting apparatus according to claim 17, wherein a reinforcing member is disposed between said housing and a portion of said second controlling circuit board on an opposite side from said electrical connection portion.

* * * * *